(12) United States Patent
Ecker et al.

(10) Patent No.: US 7,646,600 B2
(45) Date of Patent: Jan. 12, 2010

(54) STRUCTURAL SUPPORT MODULE TO PREVENT COMMON INTERFACE DEFLECTION

(75) Inventors: Richard M. Ecker, Poughkeepsie, NY (US); Michael T. Peets, Staatsburg, NY (US); Robert R. Genest, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/103,114

(22) Filed: Apr. 15, 2008

(65) Prior Publication Data

US 2009/0257191 A1 Oct. 15, 2009

(51) Int. Cl.
*H05K 7/20* (2006.01)
(52) U.S. Cl. ............... 361/690; 361/694; 361/695; 361/715
(58) Field of Classification Search ........... 361/679.49, 361/690, 695
See application file for complete search history.

(56) References Cited

U.S. PATENT DOCUMENTS

| | | | | | |
|---|---|---|---|---|---|
| 4,672,509 | A | * | 6/1987 | Speraw | 361/679.49 |
| 4,894,749 | A | * | 1/1990 | Elko et al. | 361/690 |
| 4,935,845 | A | * | 6/1990 | Schwehr et al. | 361/694 |
| 5,034,853 | A | * | 7/1991 | Mazura et al. | 361/725 |
| 5,247,427 | A | * | 9/1993 | Driscoll et al. | 361/679.39 |
| 5,477,416 | A | * | 12/1995 | Schkrohowsky et al. | 361/695 |
| 5,923,531 | A | * | 7/1999 | Bachman et al. | 361/690 |
| 6,166,919 | A | * | 12/2000 | Nicolici et al. | 361/800 |
| 6,480,379 | B1 | * | 11/2002 | Dickey et al. | 361/679.51 |
| 2003/0048615 | A1 | * | 3/2003 | King et al. | 361/724 |
| 2005/0231920 | A1 | * | 10/2005 | Culpepper et al. | 361/730 |
| 2005/0281014 | A1 | * | 12/2005 | Carullo et al. | 361/796 |
| 2006/0120038 | A1 | * | 6/2006 | Lucero et al. | 361/694 |

* cited by examiner

*Primary Examiner*—Gregory D Thompson
(74) *Attorney, Agent, or Firm*—Geraldine D. Monteleone; Lily Neff

(57) ABSTRACT

A method and incorporated assembly is provided to enhance structural integrity and prevent interface deflection in a computer rack having a midplane and capable of housing a plurality of nodes. The assembly comprises at least one structural filler book capable of being disposed above or below said midplane where any node may be disposed having geometry and material properties to resist and counteract the plugging force of said node an causing a cancellation effect. The filler book have at least two horizontal supports being connected to one another via a vertical support and a plenum an air for directing air flow. The filler book is being secured to said rack or midplane via an engagement component disposed on one of its horizontal supports. The engagement component has a complementary air duct such that when said filler book and said engagement compartment are engaged and disposed in the rack, the air duct and the plenum align to provide a tuned path of air to be delivered to electronic components plugged to said rack and midplane.

20 Claims, 4 Drawing Sheets

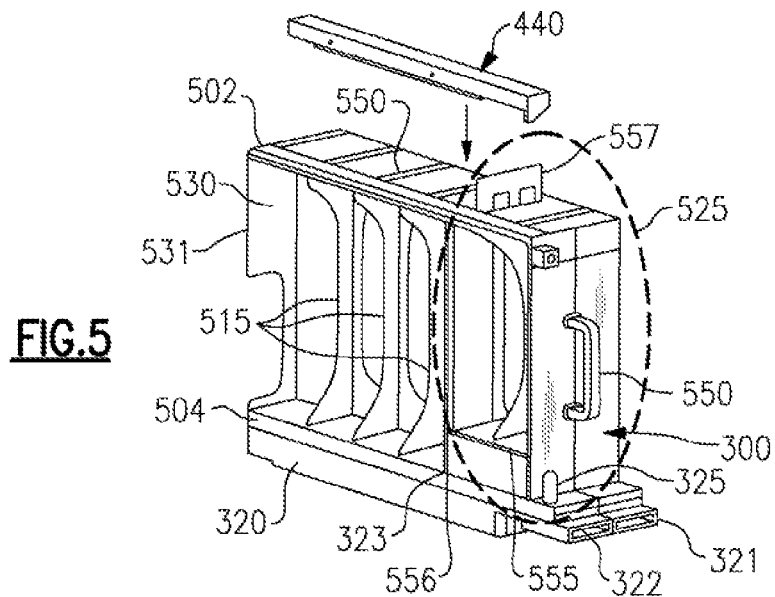
FIG. 5
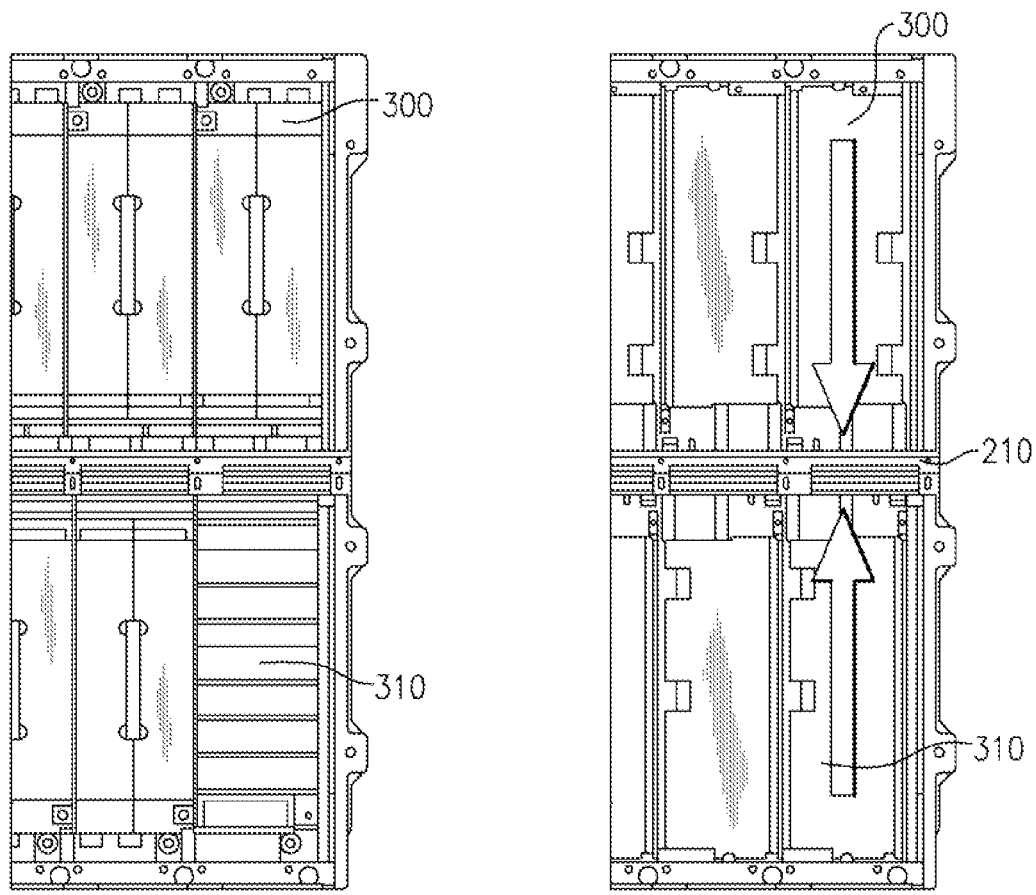
FIG. 6A
FIG. 6B

STRUCTURAL SUPPORT MODULE TO PREVENT COMMON INTERFACE DEFLECTION

BACKGROUND OF THE INVENTION

1. Field of the Invention

This invention relates to packaging of computing systems and more particularly to packaging of large computing systems that include one or more central electronic complexes (CECs).

2. Description of Background

The industry trend has been to continuously increase the number of electronic components inside computing systems. A computing system can include a simple personal computer, a network of simple computers, or one or even a network of large computers that include one or more central electronic systems (CEC). While increasing the components inside a simple computing system does create some challenges, however, such an increase create many problems in computing systems that include one or more large computers. In such instances many seemingly isolated issues affect one another, especially when packaged together in a single assembly or networked or housed to other systems that are stored in close proximity.

A challenging problem associated with design and manufacture of computing systems, and especially large ones, is the issue of minimizing dynamic loading effects. In many instances CECs and other similar large computers are housed in an assembly and the assembly is then placed in a rack or frame with other CECs or components. Since every rack and every assembly often includes a variety of electronic components (such as daughter cards, elements and components that support logic entities, mid-plane boards and the like), in a dense packaging environment, the dynamic loading effects of such components can also cause electrical and mechanical failures if not dealt with adequately.

In order to minimize adverse dynamic loading effects, prior art frames that house CECs and other large computers have traditionally been designed to incorporate components that ensure structural integrity. Unfortunately, sometimes designing structurally sound frames can create other problems during installation and service. One such problem is plug-ability of node or electronic components. This problem is becoming more pronounced especially with next generation computers that incorporate many components. Misalignment during plugging may damage connector housings, contacts, or solder connections to the board. The structural integrity and support mechanisms demanded by the need for robust package integration become more compromised as the ever increasing density results in less available space to implement this adequately.

Consequently and in light of the prior art current designs that affect overall system performance of CECs and other similar computer systems, it is desirable to implement an assembly and corresponding method of packaging that can support high density components and address dynamic loading issues of such components while improving the plug-ability of issues.

SUMMARY OF THE INVENTION

The shortcomings of the prior art are overcome and additional advantages are provided through the provision of a method and incorporated assembly that enhance structural integrity and prevent interface deflection in a computer rack having a midplane and capable of housing a plurality of nodes. The assembly comprises at least one structural filler book capable of being disposed above or below said midplane where any node may be disposed having geometry and material properties to resist and counteract the plugging force of said node an causing a cancellation effect. The filler book have at least two horizontal supports being connected to one another via a vertical support and a plenum an air for directing air flow. The filler book is being secured to said rack or midplane via an engagement component disposed on one of its horizontal supports. The engagement component has a complementary air duct such that when said filler book and said engagement compartment are engaged and disposed in the rack, the air duct and the plenum align to provide a tuned path of air to be delivered to electronic components plugged to said rack and midplane.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5 provide an illustration of a individual filler book as discussed in conjunction with embodiments of FIGS. 3 and 4; and FIGS. 6A and 6B are illustrations providing a directional representation of the canceling forces exerted during the plugging of a node by its complementary filler book.

DESCRIPTION OF THE INVENTION

Figure 1:
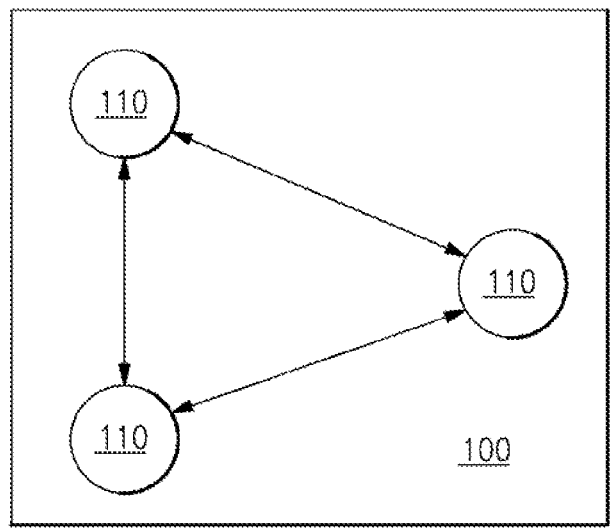
FIG. 1 is an illustration of a computing environment having a plurality of nodes in processing communication with one another.
Figure 2:
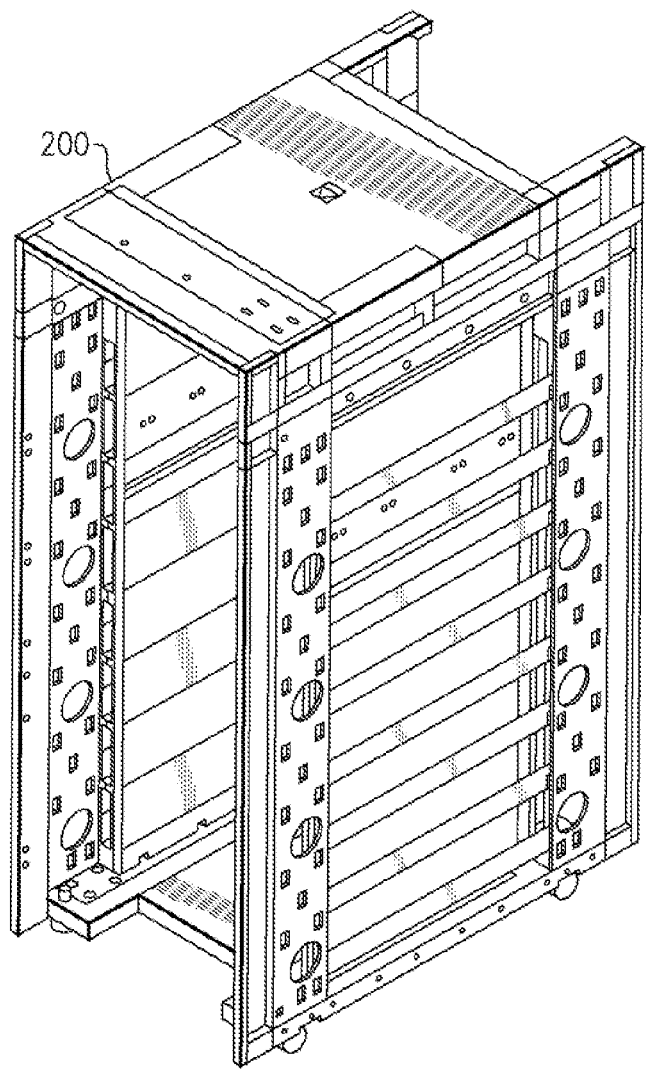
FIG. 2 is an illustration of a computer rack frame for housing CEC, nodes and other electronic components such as used in the computing environment of FIG. 1.

FIG. 1 is an illustration of a computer environment having one or more nodes 110 in processing communication with one another. Each node 110 can comprise a variety of electronic components. In larger computing environments that house servers and central electronic complexes (CECs), a plurality of nodes can be assembled in a single housing that constitutes the CEC. The CEC, one or more nodes, or a variety of other arrangements of electronic components can then be placed if desired in close proximity or even housed together. An example of such a housing is the rack frame structure 200 as illustrated in FIG. 2. The housing structure 200, although not illustrated in FIG. 2, can also include a cover.

In the embodiments that will be discussed herein, a preferred housing arrangement is introduced which incorporates the use of a horizontally mounted mid-plane assembly (i.e., parallel to the ground) with vertically plugged electronic card assemblies (a.k.a. PU Books, Nodes, etc.) using a separable interface connector system. Unfortunately, the action of plugging a node into a common midplane interface without sufficient opposing resistance to that plugging force, may allow damaging motherboard deflection. This deflection also jeopardizes connector mating alignment and registration.

Figure 3:
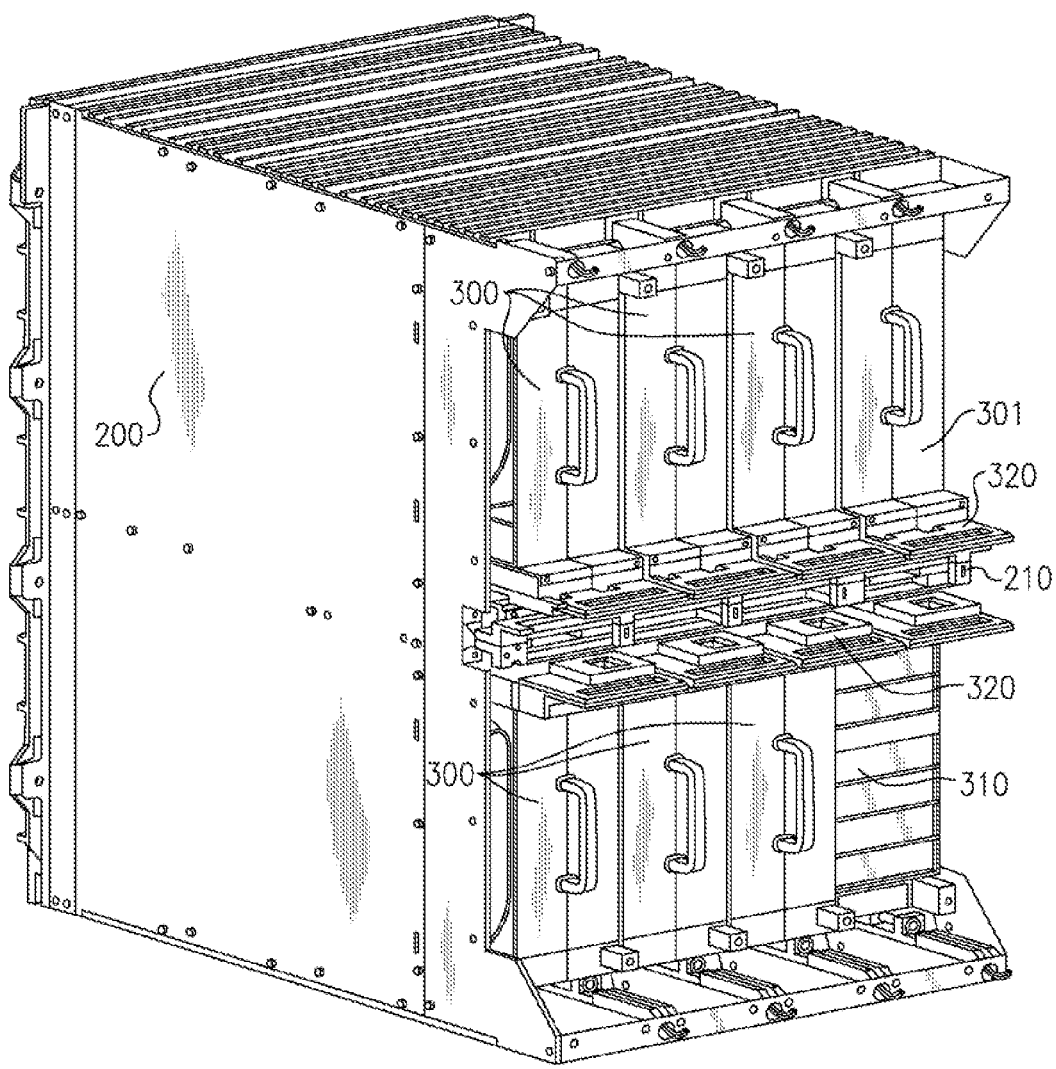
FIG. 3 is an illustration of one embodiment of the present invention showing a node and a plurality of filler books disposed in a computer rack or cage.

FIGS. 3 through 6 provide one embodiment of the present invention illustrating different views of a structural node filler book 300 (hereinafter filler book). As shown in FIG. 3, the filler book 300 occupies an opposing node cavity and has geometry and material properties to resist the plugging force encountered. In the particular application as provided by the illustrated example of FIG. 3, all positions in the cage assembly will be occupied by either a processor node, referenced as 310, or this structural filler books 300. This configuration also serves to enhance the structural integrity of the cage assembly 200 thereby reducing resultant damage and critical misalignments during shipping.

In the particular example shown in the illustration of FIG. 3, there are eight positions available. The arrangement in this case is for four nodes to be disposed vertically above four other nodes. Although, not particularly visible in this illustration, but a midplane 210 structurally separates the first set of nodes vertically disposed over a second set of nodes. It is possible, of course, to have more or less nodes than shown in this example in different computing environments using alternate embodiments than that illustrated in FIG. 3.

In the example of FIG. 3, the case scenario provides for there to be eight positions available in the rack or in a cage assembly 200. In this case, there is only one node available and installed as shown (310). The other 7 places that were dedicated for the nodes are now filled with the filler books 300. The filling of the rack also ensures the voids created by missing nodes do not provide a weak structural point which can lead to the failure of the structural integrity of the whole environment as caused by dynamic loading effects and stress. In this way, the entire rack or cage assembly is structurally enhanced with all positions occupied.

In a preferred embodiment, the filler books 300 are secured to the rack 200 and midplane 210 via an engagement component 320 as will be discussed later.

Referring back to the figure, it should be noted that the filler book (referenced individually also as 301 to distinguish it from others) that is disposed over the node 310 as shown in the figure adds an additional benefit. This filler book 301 is instrumental in providing forces that oppose the first node's plugging forces. This concept will be further discussed in conjunction with the embodiment provided in FIGS. 6A and 6B.

Figure 4:
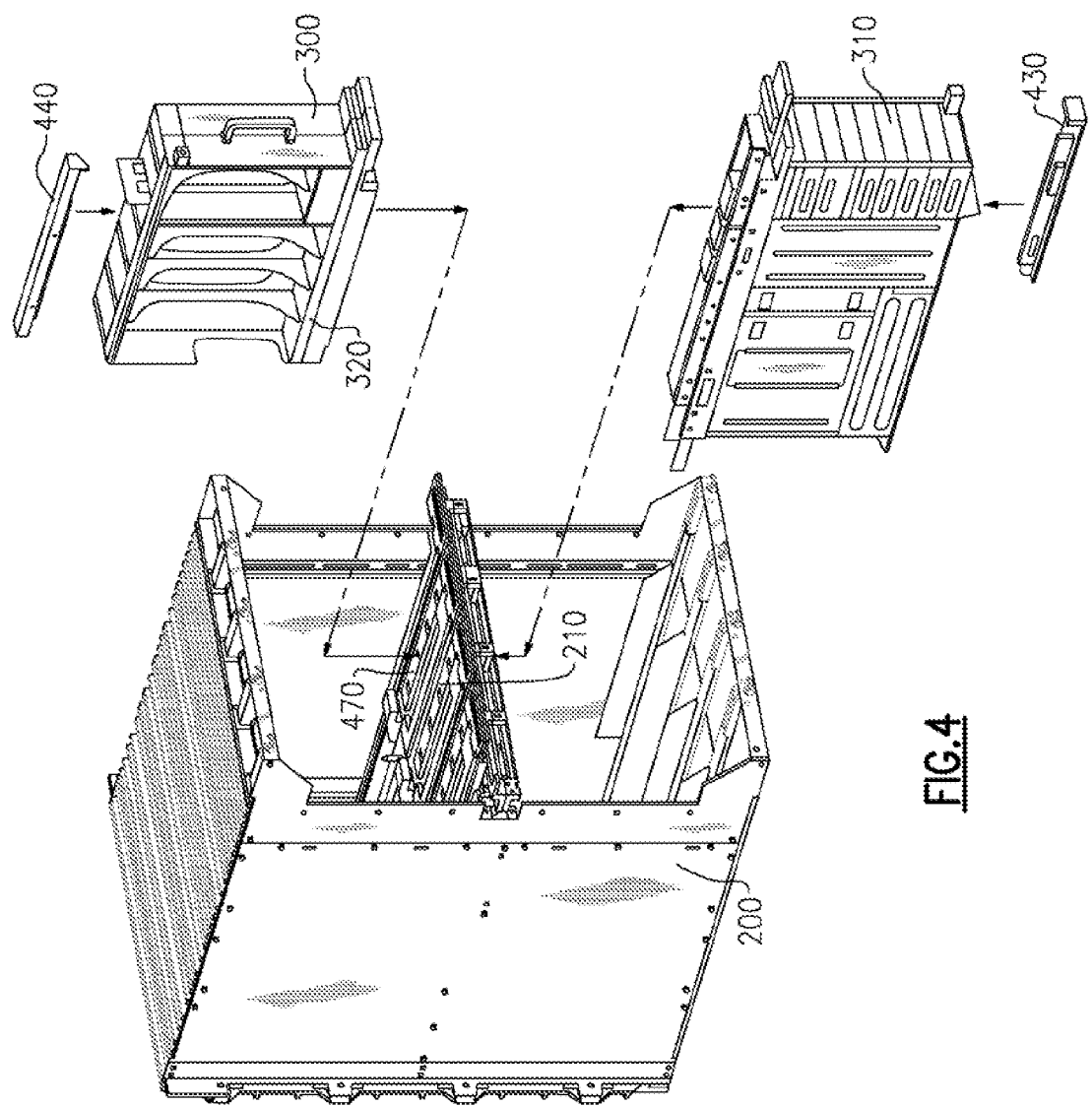
FIG. 4 is an overall description of specific components including the rack ad filler books of the embodiment of FIG. 3 as being assembled.

FIG. 4 is an illustration of different components of the filler book 300 as assembled fully and shown in the embodiment of FIG. 3. In FIG. 3, for ease of understanding and reference a computer cage or rack 200 is shown having a midplane 210. The different components of the filler book 300 that was previously shown assembled will now be discussed individually and with respect to disposition of one another during assembly. A separate discussion is also conducted, when appropriate, to make disposition of each part clear with respect to the rack or cage 200 and midplane 210.

FIG. 5 provides a perspective side illustration of the filler book 300 as shown and discussed in the embodiments of FIGS. 3 and 4. In the embodiment of FIG. 5, one example of the structure of filler book 300 is shown and will be presently discussed, although as can be appreciated, other similar arrangements can be provided in alternate embodiments.

The filler book 300 as provided in the example of FIG. 5 comprises at least two horizontal supports and at least one vertical support connecting the two vertical supports to one another. For ease of understanding these horizontal supports will be further defined as a first and second horizontal support 502 and 504. Since the illustration of FIG. 5 places the first and second horizontal support in a top and bottom position, for ease of reference these will be referred to as top support 502 and bottom support 504 with the understanding that the direction of these are arbitrary and such and independent of direction. Therefore the direction of top and bottom can be reversed depending on how the filler book is being inserted into the rack 200 and shall not constitute any kind of limitation on the teachings of the present invention.

As discussed, the filler book(s) 300 are secured to the rack/midplane via an engagement component 320. The engagement component has a handle 321 for disposing and removing the component 320 and the filler book 300 into and out of the rack/midplane (200/210) as desired. In a preferred embodiment, the filler book(s) 300 dovetail into the engagement component 320. Depending on whether the filler book is to disposed above or below the midplane 210, the engagement component 320 can be engaged on top or below the filler book 300. This can be viewed easily in FIG. 3. Referring back to the example provided in FIG. 5, in this case, the engagement component can be disposed such that either the top or bottom horizontal surfaces 502 or 504 dovetail into the component 320.

It should be noted that the filler book(s) 300 and the engagement component 320 are designed to be complementary to one another. In a preferred embodiment, once the filler book(s) 300 are engaged with the engagement component 320, the back end of the filler book (300) engages with a back end of the engagement component 320 such that there is no further movement. This can be accomplished in a variety of ways, such as known to those skilled in the art. For example a protruding lip can be incorporated into the design of the filler book 300 or the engagement component 320 alternatively that can catch the other. In addition, once the filler book(s) 300 and the engagement component 320 are engaged, a fastener 325 such as a captive screw or other similar fastening means as known to those skilled in the art can be provided to secure the engagement component 320 and the filler book 300 to one another in such as manner that they become a single unit. Once this has been accomplished, the unit can then be disposed inside the rack 200 and engaged with midplane 210 as desired.

The engagement component 320 also comprises at least an air duct 322, which once engaged with the a plenum 555 in the filler book 300, directs air flow as will be discussed later.

Referring back to the structure of the filler book 300 itself, the filler book as discussed is comprised of a first and second horizontal supports (502 and 504) and at least one vertical support referenced as 515. In the example of FIG. 5, a plurality of vertical supports are provided. In a preferred embodiment, the vertical supports 515, as illustrated in the figure, have an I-beam design which provides a thicker, tapered shape at their junction with the top and bottom horizontal supports. In the illustrated example, the I-beams are disposed such that their direction extends inwards and outwards from the filler book 300 (internal and external to filler books) but this is not a requirement. Since the vertical supports 515 are not adjacent and touching, an opening is provided between them. The I-beam design and the openings maximizes the support provided by the filler book while providing an optimally design light weight unit. Alteration in the design of one or more vertical supports can be provided also to selectively provide more support or custom design them for a complementary shape with the rack 200, midplane 210 or the engagement component 320. This is provided by way of example in the vertical support differently referenced as 531.

Another issue that is addressed by the filler books (300) of the present invention is that of heat dissipation. Heat dissipation if unresolved, can result in electronic and mechanical failures that will affect overall system performance. As can be easily understood, the heat dissipation increases as the packaging density increases. In larger computing systems, such as the ones that include one or more CECs, the problem of heat dissipation becomes of particular concern.

In a preferred embodiment, as will be discussed presently, a plenum is provided to address this issue. The plenum 555 is part of a front compartment 525 of the filler book 300. Beside the plenum 555 which will be presently discussed, the front compartment 525, also comprises a handle 550 disposed on a vertical support. In this embodiment, this vertical support upon which the handle is disposed has a substantially flat surface. The handle 555 is used to engage and disengage the filler book 300 from the engagement compartment 320.

The plenum is disposed behind the vertical surface having the handle 550 and aligns with the air duct 322 of the engagement compartment 320 and directs air flow away with having another opening 323 disposed as shown behind away from the vertical side having the handle 555. To provide a true air channel, one or more air seals 556 can be provided to the sides of the filler book's front compartment 525 and an air flap 557, preferably of rubber, can be disposed on the horizontal support opposite the engagement component 320 (i.e. here the top horizontal support 502) at the outer boundary of the front compartment 525 as shown to direct air flow appropriately once the filler book is disposed in the rack 200. Additional vertical supports 515, that preferably have the same I-beam design can be disposed over the air duct compartment 555 as desired.

The plenum 555 and the air duct of the engagement compartment 320 are incorporated in order to provide a tuned path of air delivery to I/O cards plugged inside the rack 200 and at the midplane 210 such as was shown in previous figures (FIG. 3 specially) to provide a non-structural air flow dam. As such, it forms with features of the structural book to complete an air seal maintaining CEC internal air flow for cooling. A CEC or frame mounted blower and its components then in such a case can provide the needed node cooling. In this way, air containment and direction are maintained by this structural book as well.

In a preferred embodiment, filler books 300 are fabricated of an engineered plastic, such as a structural foam.

The top support 502 (horizontal support not to be engaged with the engagement compartment) can also either contoured directly or have an additional part secured to it that enables a node locking mechanism, 440, to be secured to it once the filler book is disposed inside the rack or cage assembly 200. This is to ensure that if any shock or vibration is sustained by the rack or cage assembly, whether during catastrophic events as part of such everyday events such as transportation and storage of the rack, the filler books remain securely in place.

Referring back to FIG. 4, it is evident as how each component fits together. The filler book 300 and engagement component 320 as well as any nodes 310 are disposed in the rack 200, such that either top or bottom of the node 310 or filler book 300 is in contact with the midplane 210. A node locking mechanism is 430 is provided to secure the node to the rack or assembly 200. Similarly the same or a similar node locking mechanism, referenced differently as 440 for ease of identification, can be provided to secure the filler book 300 into the rack 200. The filler books are designed such that they can either be disposed above or below the midplane and a different design of filler books 300 is not needed based on intended location.

FIGS. 6A and 6B are illustrations providing a directional representation of the canceling forces exerted during the plugging of a node 310 by its complementary filler book 300. As illustrated, once plugged, the filler book 300 provides the additional advantage of providing the intended plugging force cancellation during vertical plugging action. In keeping with the examples provided in FIGS. 3 and 4, in this case as shown, the node 310 was disposed below the midplane 210 while a filler book 300 was disposed over the node above the midplane 210. As shown from the direction of the arrows, while the node provides an upward plugging force, once in place the filler book provides an opposing downward force. In this way if nodes are disposed one by one above and below spaces that are filled by the filler books 300 no structural integrity problems will be caused by their plugging forces and motion.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An assembly to enhance structural integrity and prevent interface deflection in a computer rack having a midplane and capable of housing a plurality of nodes, said assembly comprising:

at least one structural filler book capable of being disposed above or below said midplane where any node may be disposed having geometry and material properties to resist and counteract the plugging force of said node and causing a cancellation effect;

said filler book having at least two horizontal supports being connected to one another via a vertical support and a plenum for directing air flow; and said filler book being secured to said rack or midplane via an engagement component disposed on one of said two horizontal supports;

said engagement component having a complementary air duct such that when said filler book and said engagement component are engaged and secured in said rack, said air duct and said plenum align to provide a tuned path of air to be delivered to electronic components plugged to said rack and midplane.

2. A method of enhance structural integrity and prevent deflection in a computing environment having a rack with a midplane capable of receiving a plurality of nodes above and below said midplane, comprising the steps:

prior to inserting said nodes, inserting a structural filler book above or below said midplane where said node is to be disposed such that said filler book provides a plugging cancellation force against said node during its vertical plugging action by its geometry and material properties;

said structural filler book having at least two horizontal supports connected via at least one vertical support to one another and a plenum for directing air flow;

securing said filler book to said rack or midplane via an engagement component having a complementary air duct such that when said filler book and said engagement compartment are engaged and secured in said rack, said air duct and plenum align to provide a tuned path of air to be delivered to electronic components plugged to said rack and midplane.

3. An assembly for preventing interface deflection in a computer rack having a midplane; comprising:

first and second horizontal supports, connected to one another by a plurality of vertical structural supports and a front compartment disposed between a front vertical structural support and the remaining vertical structural supports;

said vertical support structures disposed with openings between them;

said front compartment also having a plenum for directing air flow; and said filler book being secured to said rack or midplane via an engagement component along one of its horizontal supports;

said engagement component having a complementary air duct such that when said filler book and said engagement compartment are engaged and secured in said rack, said air duct and said plenum align to provide a tuned path of air to be delivered to electronic components plugged to said rack and midplane.

4. The assembly of claim 3, wherein said vertical supports comprise an I-beam structure.

5. The assembly of claim 4, wherein said I-beam structures extend in a direction internal and external to said filler book.

6. The assembly of claim 3, wherein said engagement component includes a handle for disposing and removing it and said filler book once engaged into and out of the rack/midplane.

7. The assembly of claim 3, wherein said filler book dovetail into and out of said engagement component.

8. The assembly of claim 3, wherein said filler book can be disposed above or below the midplane and said engagement component is engaged over or below said filler book to address location of said filler book with respect to said midplane.

9. The assembly of claim 3, wherein said filler book and said engagement component are designed to be complementary to one another.

10. The assembly of claim 3, wherein a back end of said engagement component and that of said filler book engages together to allow no further movement of said filler book along said engagement component.

11. The assembly of claim 10, wherein a fastener can secure said filler book further to said engagement component once a final position is achieved to enable said filler book and said engagement component to become a single unit.

12. The assembly of claim 11, wherein said fastener is a captive screw.

13. The assembly of claim 3, wherein said front compartment also comprises a handle disposed on a front vertical support for engaging and disengaging said filler book from said engagement compartment.

14. The assembly of claim 13, wherein said front vertical support upon which said handle is disposed has a substantially flat surface.

15. The assembly of claim 3, wherein one or more air seals are provided on vertical sides of said filler book's front compartment.

16. The assembly of claim 15, wherein an air flap is also provided on one of said horizontal supports opposite where said engagement component is to be engaged such that said flap is disposed on an inner boundary of said front compartment.

17. The assembly of claim 16, wherein said air flap is a rubber flap.

18. The assembly of claim 3, wherein said filler book is fabricated of an engineered plastic.

19. The assembly of claim 18, wherein said filler book is fabricated of a structural foam.

20. The assembly of claim 3, wherein a node locking mechanism can engage with said filler book on one of said horizontal supports not engaged with said engagement compartment to ensure even a more secure fit with said rack and midplane.

* * * * *